(12) United States Patent
Dvorak et al.

(10) Patent No.: US 10,234,499 B1
(45) Date of Patent: Mar. 19, 2019

(54) INTEGRATED CIRCUIT TESTING USING ON-CHIP ELECTRICAL TEST STRUCTURE

(71) Applicant: KEYSIGHT TECHNOLOGIES, INC., Loveland, CO (US)

(72) Inventors: Martin W. Dvorak, Santa Rosa, CA (US); Ben Keppeler, Loveland, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 19 days.

(21) Appl. No.: 15/225,807

(22) Filed: Aug. 1, 2016

(51) Int. Cl.
*G01R 31/28* (2006.01)

(52) U.S. Cl.
CPC ................... *G01R 31/2884* (2013.01)

(58) Field of Classification Search
CPC .......... G01R 31/31924; G01R 31/3004; G11C 29/56
See application file for complete search history.

(56) References Cited

U.S. PATENT DOCUMENTS

| | | | |
|---|---|---|---|
| 5,514,974 A | 5/1996 | Bouldin | |
| 6,221,681 B1 | 4/2001 | Sugasawara | |
| 6,313,687 B1* | 11/2001 | Banu | H03H 11/1291 327/317 |
| 6,359,461 B1* | 3/2002 | Bush | G01R 31/275 324/762.09 |
| 6,436,726 B2 | 8/2002 | Look et al. | |
| 6,878,561 B2 | 4/2005 | Look et al. | |
| 6,897,476 B1 | 5/2005 | Kim et al. | |
| 7,444,604 B2* | 10/2008 | Croix | G06F 17/5036 703/14 |
| 7,494,829 B2 | 2/2009 | Subramaniam et al. | |
| 7,683,651 B2 | 3/2010 | Chanda et al. | |
| 7,935,965 B1 | 5/2011 | Brozek et al. | |
| 8,126,681 B2 | 2/2012 | Nahar et al. | |
| 8,264,235 B2 | 9/2012 | De Vries et al. | |
| 8,977,513 B2* | 3/2015 | Selva | G01R 31/31935 702/117 |
| 9,250,286 B2 | 2/2016 | Tu et al. | |
| 9,383,404 B2 | 7/2016 | Gambino et al. | |
| 2003/0085461 A1* | 5/2003 | Sakiyama | G01R 31/2853 257/700 |
| 2007/0182478 A1* | 8/2007 | Mun | G05F 3/30 327/539 |
| 2009/0271166 A1* | 10/2009 | Stanley | G06F 17/5036 703/14 |
| 2010/0174955 A1* | 7/2010 | Carnevale | G11C 5/04 714/718 |

(Continued)

*Primary Examiner* — Giovanni Astacio-Oquendo
*Assistant Examiner* — Alvaro Fortich

(57) ABSTRACT

Techniques and test structures for determining reliability and performance characteristics of an integrated circuit (IC) device are disclosed. For example, an IC device includes multiple functional elements and multiple test elements. The test elements are electrically coupled in series between a first test port and a second test port. A method of testing the IC device includes applying an electrical stimulus between the first test port and the second test port, measuring a parametric value in response to the electrical stimulus, comparing the parametric value and a statistical value, and determining a pass or fail status of the IC device. The statistical value is representative of a predicted reliability of the IC device.

7 Claims, 7 Drawing Sheets

(56) References Cited

U.S. PATENT DOCUMENTS

| | | | |
|---|---|---|---|
| 2010/0252828 A1* | 10/2010 | Grillberger | H01L 22/34 257/48 |
| 2011/0163771 A1* | 7/2011 | Kojima | G01R 31/31924 324/750.01 |
| 2012/0098557 A1* | 4/2012 | Krauss | H03M 1/109 324/750.3 |
| 2012/0268851 A1* | 10/2012 | Nishio | H02M 1/34 361/58 |
| 2014/0247064 A1* | 9/2014 | Rabe | G01R 31/2843 324/750.01 |

* cited by examiner

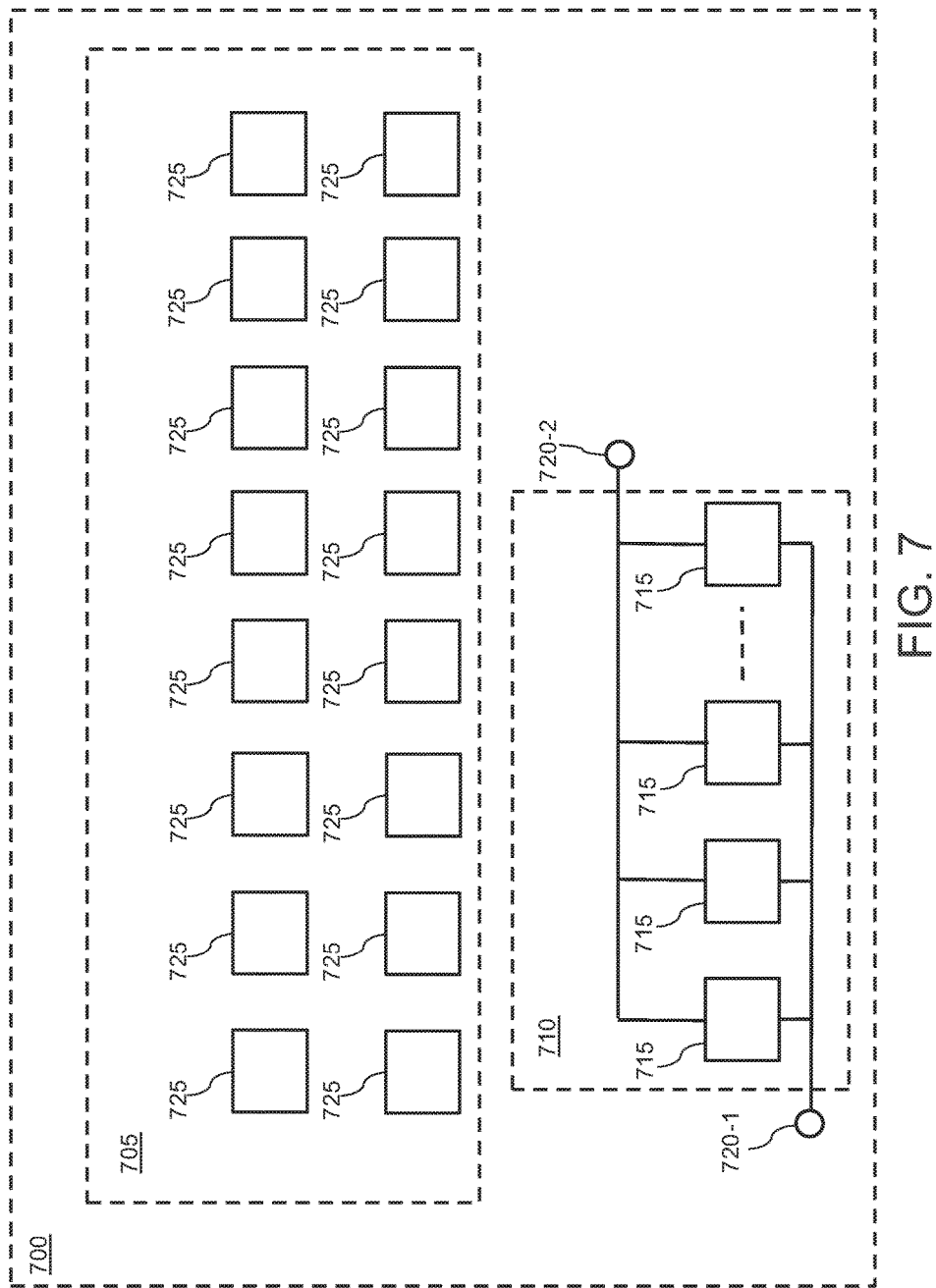

INTEGRATED CIRCUIT TESTING USING ON-CHIP ELECTRICAL TEST STRUCTURE

TECHNICAL FIELD

The presently disclosed subject matter relates to integrated circuits. Particularly, the presently disclosed subject matter relates to techniques and test structures for determining reliability and performance characteristics of integrated circuits.

BACKGROUND

Integrated circuits (ICs) continue to become more advanced and require more functional elements. As such the geometries of these functional elements become smaller and deviations within the manufacturing process become much more critical. These deviations may degrade performance criteria and more importantly reliability. Performance criteria can normally be measured during wafer and device test. However, reliability may be much more difficult to determine. Specifically, dimensions of functional elements are reduced to the limits of the manufacturing process. As such, some ICs may have functional element dimensions too small for adequate reliability, while performance criteria of these devices may not degrade but even be enhanced. Microscopy methods for screening can be used to inspect dimensions. However, with processes less than 100 nanometers, a scanning electron microscope (SEM) can required. This technique is not practical on a per IC device basis in the manufacturing process.

Therefore, there is a need for techniques and test structures to ensure reliability of ICs at both a wafer level and a device level during the manufacturing process.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Techniques and test structures for determining reliability and performance characteristics of an integrated circuit (IC) device are disclosed herein. In a representative embodiment, an IC device includes multiple functional elements and multiple test elements. The test elements are electrically coupled in series between a first test port and a second test port. A method of testing the IC device includes applying an electrical stimulus between the first and second test ports, measuring a parametric value in response to the electrical stimulus, comparing the parametric value and a statistical value, and determining a pass or fail status of the IC device. The statistical value is representative of a predicted reliability of the IC device.

In other embodiments, each of the functional elements may be substantially similar to a first test element, and each of the test elements may be substantially similar. The test elements may number between 2 and 20. The functional elements may number at least 20.

In other embodiments, the first test element may include a bipolar junction transistor (BJT) having a base metal structure and an emitter metal structure. The test elements may be electrically coupled such that the parametric value is representative of at least one of a width of the base metal structure, a width of the emitter metal structure, or an alignment of the emitter metal structure to the base metal structure. The predicted reliability may be a predicted electromigration reliability and the parametric value may be a resistive value. The electrical stimulus may be applied by a parametric test system, and the first and second test ports may be probing pads. The first test port may also be one of a supply voltage pad or a ground pad.

In another representative embodiment, an IC device also includes multiple functional elements and multiple test elements. The test elements are electrically coupled in parallel between a first test port and a second test port. A method of testing the IC device includes applying an electrical stimulus between the first and second test ports, measuring a parametric value in response to the electrical stimulus, and determining a predicted performance parameter of a first functional element of the functional elements. The predicted performance parameter is based on the parametric value and an integer quantity of the test elements.

In other embodiments, each of the functional elements may be substantially similar to a first test element of the test elements, and each of the test elements may be substantially similar.

In other embodiments, the first test element may include at least one of a bipolar junction transistor (BJT), a field-effect transistor (FET), a diode, or a capacitor. The parametric value may be a current value. The electrical stimulus may be applied by a parametric test system, and the first and second test ports may be probing pads. The first test port may also be one of a supply voltage pad or a ground pad.

In other embodiments, the electrical stimulus may be a voltage bias stimulus and the predicted performance parameter may be a leakage current. The predicted performance parameter may also be determined at least in part by dividing the parametric value by the integer quantity.

In another representative embodiment, an IC device also includes multiple functional elements and multiple test elements that are electrically coupled between a first test port and a second test port. Each test element includes a linear element and a non-linear element. A method of testing the IC device includes applying a first electrical stimulus between the first and second test ports, and measuring a first parametric value in response to the first electrical stimulus. The method further includes applying a second electrical stimulus between the first and second test ports, and measuring a second parametric value in response to the second electrical stimulus. A predicted performance parameter is then determined of a first functional element of the functional elements, based on the first and second parametric values and an integer quantity of the plurality of test elements.

BRIEF DESCRIPTION OF THE DRAWINGS

The illustrated embodiments of the disclosed subject matter will be best understood by reference to the drawings, wherein like parts are designated by like numerals throughout. The following description is intended only by way of example, and simply illustrates certain selected embodiments of devices, systems, and processes that are consistent with the disclosed subject matter as claimed herein.

FIG. 7 is a schematic diagram of an IC device that includes multiple functional elements and multiple test elements electrically coupled in parallel in accordance with embodiments of the present disclosure.

DETAILED DESCRIPTION

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings. As used in the specification and appended claims, the terms 'a', 'an' and 'the' include both singular and plural referents, unless the context clearly dictates otherwise. Thus, for example, 'a device' includes one device and plural devices.

The described embodiments relate to integrated circuits (ICs). Particularly, the described embodiments relate to techniques and test structures for determining reliability and performance characteristics of an IC device. The techniques may be applied during the normal manufacturing process through electrical testing. As such, microscopy methods are not required. This electrical testing may be performed while the IC device is still within an IC wafer or after packaging as a component.

Figure 1:
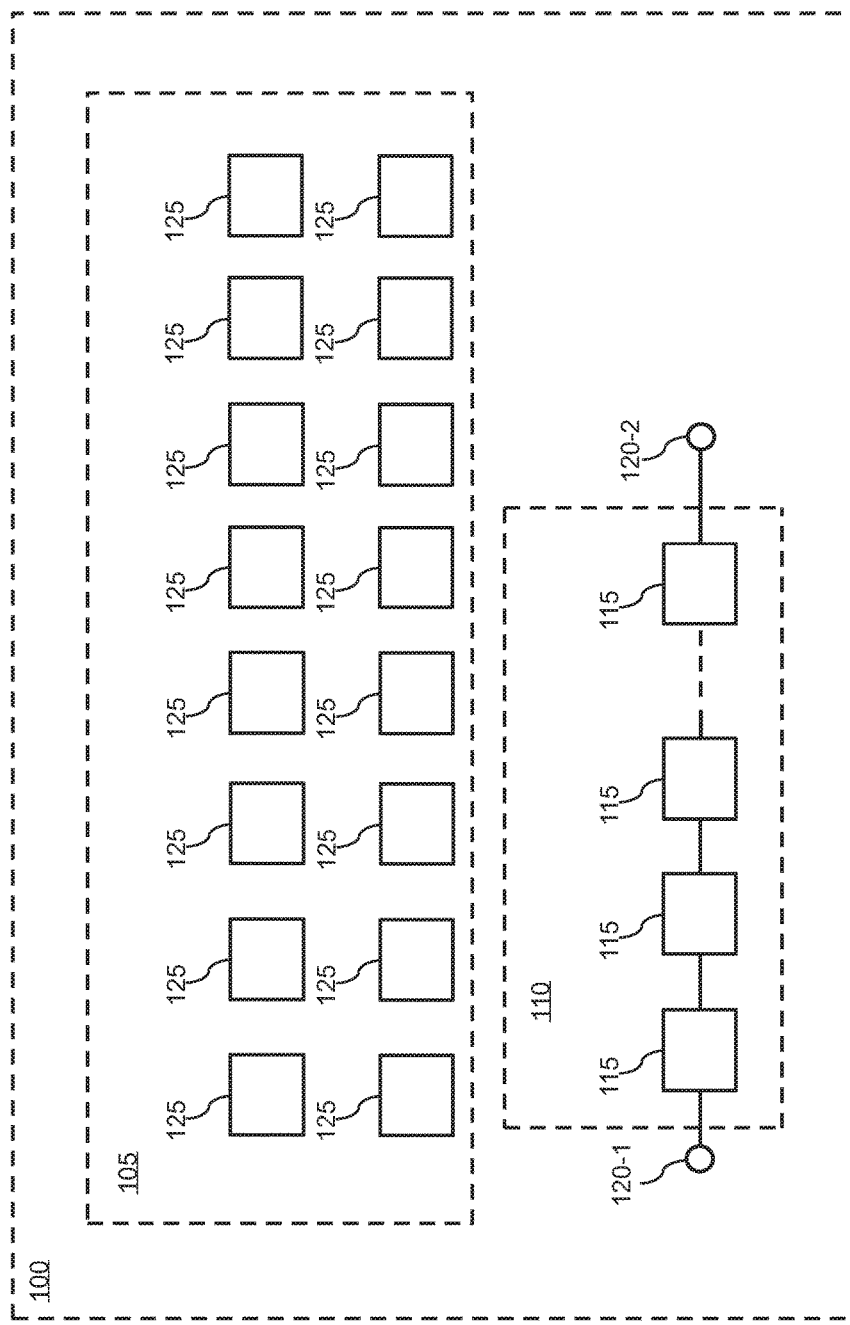
FIG. 1 is a schematic diagram of an IC device that includes multiple functional elements and multiple test elements electrically coupled in series in accordance with embodiments of the present disclosure.

FIG. 1 illustrates a schematic diagram of an IC device 100 that includes multiple functional elements 105 and multiple test elements 110 in accordance with embodiments of the present disclosure. Each test element 115 of test elements 110 are electrically coupled in series between a first test port 120-1 and a second test port 120-2, forming a test structure. Each test element 115 is substantially similar to each functional element 125 of functional elements 105. For example, each test element 115 and each functional element 125 may be a basic transistor element associated with a manufacturing process of the IC device. In other embodiments, the IC device 100 may be a digital application specific integrated circuit (ASIC). In other embodiments, the IC device 100 may be an analog ASIC. In other embodiments, the IC device 100 may be a mixed-signal ASIC. In other embodiments, test elements 110 may be between 2 and 20 test elements 115 and functional elements 105 may be at least 20 functional elements 125.

By coupling the multiple test elements 110 between the first and second test ports 120-1 and 120-3, multiple failure modes may be detected in a single test. Additionally the resolution of the single test is increased wherein a measured parameter of a single test element 115 is multiplied by the number of test elements 115. A method of testing the IC device 100 includes applying an electrical stimulus between the first and second test ports 120-1 and 120-2. A parametric value is measured in response to the electrical stimulus. The parametric values may be measured before, during, or after performance testing of the IC device 100 using a parametric test system. The parametric test system may be a precision semiconductor parametric analyzer. The parametric value is then compared to a statistical value and a pass or fail status of the IC device 100 is determined. The statistical value is representative of a predicted reliability of the IC device 100. The statistical value may be determined by measuring parametric values of multiple test structures on a single wafer. In other embodiments, the statistical value may be determined using a statistical median of the parametric values. In other embodiments, the statistical value may be determined from a statistical deviation of the statistical median. In other embodiments, the statistical value may be determined from a filtered standard deviation from an interquartile range of the parametric values. As such, IC devices having parametric values that are statistical outliers may be rejected as not achieving a reliability criteria. In other embodiments, the statistical value may be determined by measuring multiple test structures across multiple IC devices from multiple wafers. In other embodiments, the statistical value may be determined using computer modelling and simulation of the IC device 100.

In other embodiments, the actual reliability of the IC device 100 may be related to a subset of critical dimensions of each functional element 125 of the functional elements 105. Analysis of reliability of failure modes and their relative probabilities may be ranked, for example in a Pareto chart, and the dominant failure mode or modes may determine the design of the functional element 25. As such determining the critical dimensions of a test element 115 of the test structure may be used to determine the predicted reliability. As such, the parametric value may be a resistive value that is representative of a critical dimension. For example, each test element 115 and each functional element 125 may include a bipolar junction transistor (BJT) formed as a basic transistor element associated with the manufacturing process of the IC device. Each BJT may include a base metal structure and an emitter metal structure. Critical dimensions related to a predicted reliability of the BJT may be a width of the base metal structure, a width of the emitter metal structure, or an alignment of the emitter metal structure to the base metal structure. More specifically, the predicted reliability may be a predicted electromigration reliability associated with the critical dimensions. Electromigration is the gradual movement of conducting material within the IC device 100 due to momentum transfer between conducting electrons and diffusing metal atoms. Electromigration increases as current densities increase from structure width decreases. Electromigration may eventually cause a loss of an internal connection of the IC device 100.

Figure 2:
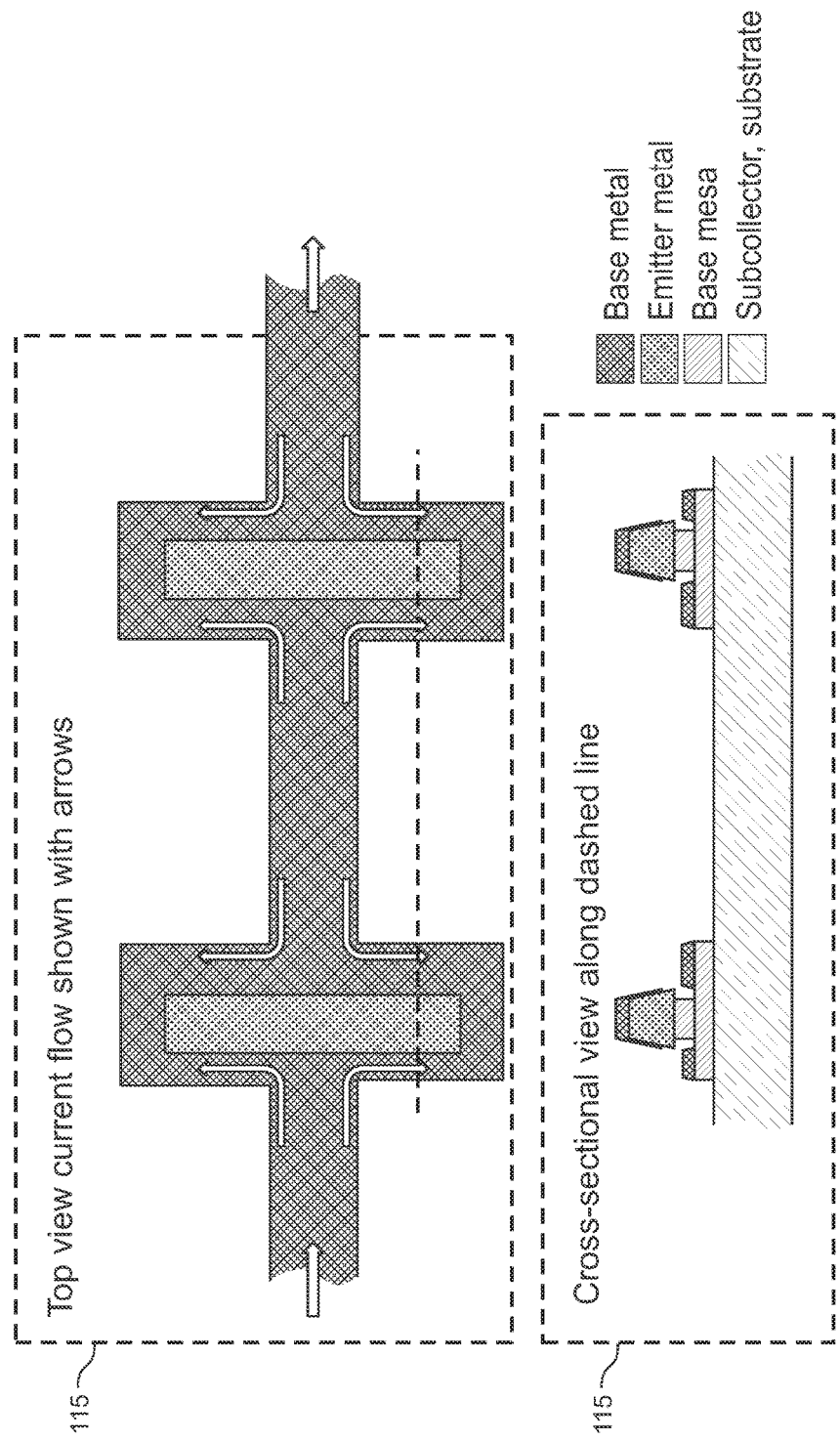
FIG. 2 is a top view and a cross-sectional side view of a test element in accordance with embodiments of the present disclosure.

FIG. 2 illustrates a top view and a cross-sectional side view of a test element 115 that includes two BJT transistors in accordance with embodiments of the present disclosure.

A top view illustrates current flow within the base metal structures. As shown, the current flow is forced around the periphery of the test element 115. When the base metal structures are formed too narrow, the reliability is reduced of the test element 115 due to electromigration over the lifetime of the IC device 100. As such, the resistance of the test element 115 is increased due to the narrowing. A cross-sectional view illustrates IC layers including base metal structures, emitter metal structures, base mesa structures, and a subcollector substrate structure. In other embodiments, the left or right misalignment between the base metal structures and the emitter metal structures may affect resistance of the test element 115. For example, the manufacturing process of the IC device 100 may cause the base metal width to be determined by the tolerances of a lithography process that was used for base metal definition, emitter metal definition, as well as their mutual alignment. Incomplete etching and over etching may affect widths of base and emitter metal structures. Overlay errors of multiple layer masks may degrade the alignment. In other embodiments, a shadow evaporation self-aligned base metal process may be used.

Figure 3:
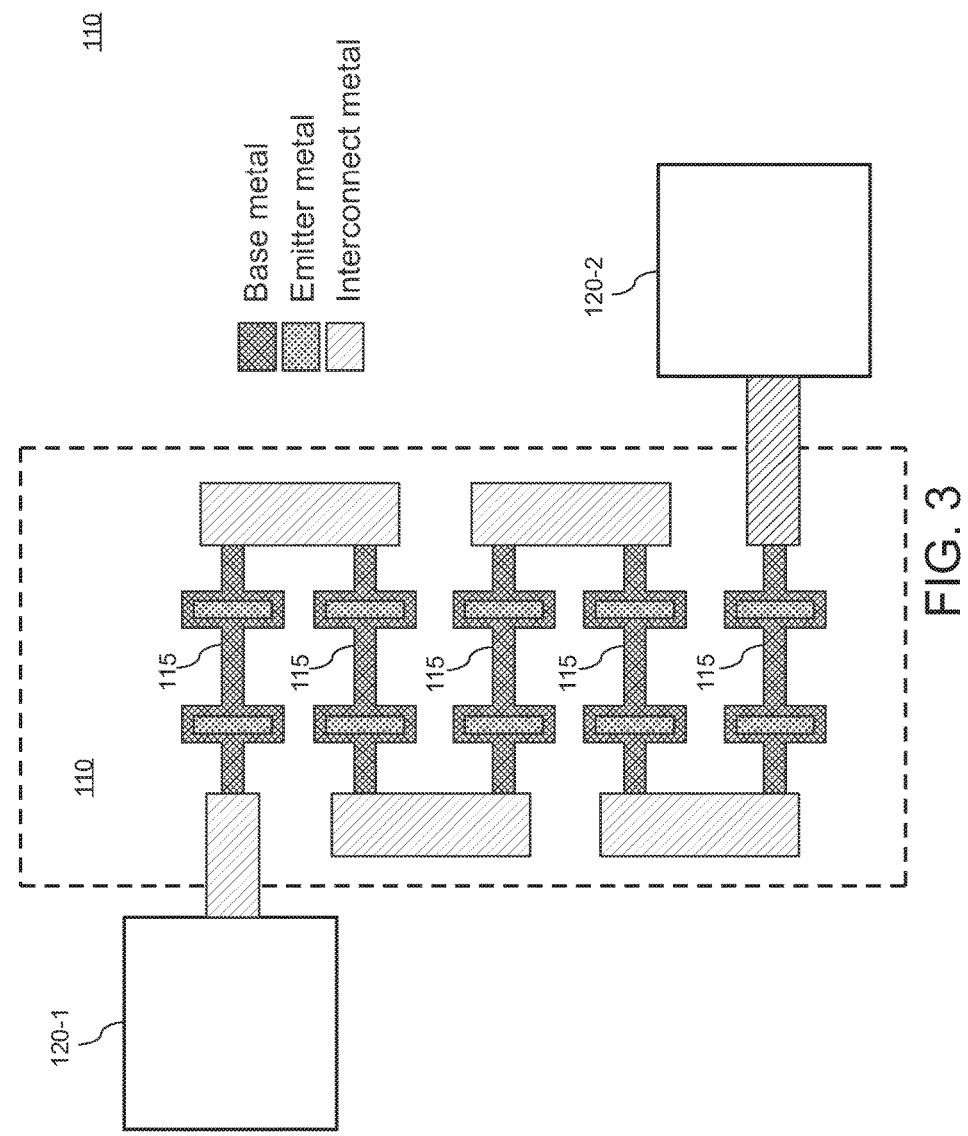
FIG. 3 is a schematic diagram of test elements electrically coupled in series between first and second test ports in accordance with embodiments of the present disclosure.

FIG. 3 illustrates a schematic diagram of the test structure including the test elements 110 of FIG. 2 in accordance with embodiments of the present disclosure. Interconnect metal structures provide the electrical couplings between test elements 115 and the first and second test ports 120-1 and 120-2. The electrical stimulus may be applied by the parametric test system having an ohmmeter function that measures resistance (not shown in FIG. 3). The electrical stimulus may be a current bias stimulus applied between the first and second test ports 120-1 and 120-2. As such, the ohmmeter function may read a voltage across the first and second test ports 120-1 and 120-2, and calculate a resistance of test elements 110. In other embodiments, the electrical stimulus may be a voltage bias stimulus applied across the first and second test ports 120-1 and 120-2. As such, the ohmmeter function may measure a current between the first and second test ports 120-1 and 120-2 and calculate a resistance of test elements 110. The ohmmeter function may have a current resolution of 5 pico-amps or less. In other embodiments, the first and second test ports 120-1 and 120-2 may be probing pads on the wafer.

In other embodiments, the first and second test ports 120-1 and 120-2 may be bonding pads on the IC device. In other embodiments the first and second test ports 120-1 and 120-2 may be isolated pads used primarily for manufacturing test without any electrical connection to the functional elements 105. In other embodiments, the first test port 120-1 may be one of a supply voltage pad or a ground pad for functional elements 105.

Figure 4:
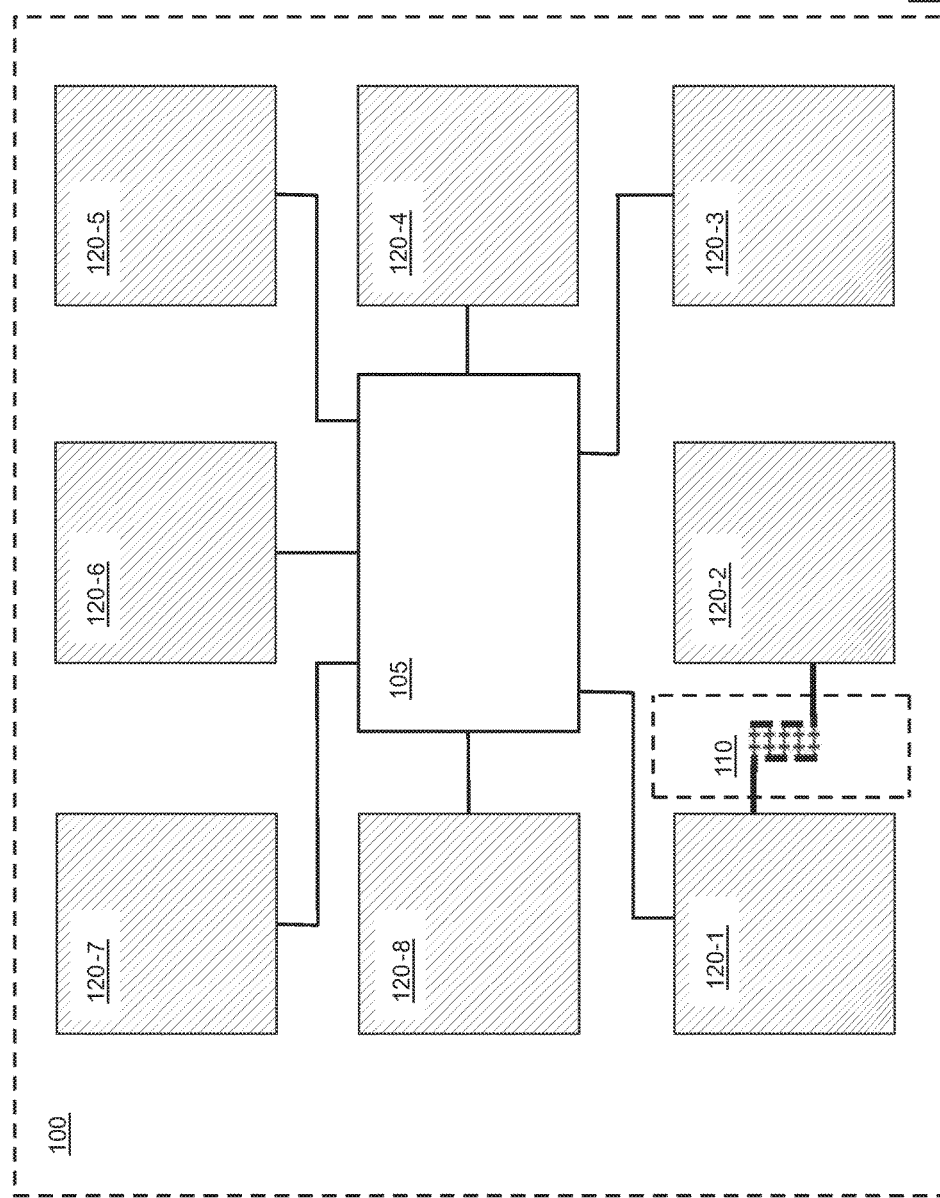
FIG. 4 is a schematic diagram of the IC device including test pads and functional pads in accordance with embodiments of the present disclosure.

FIG. 4 illustrates a schematic diagram of the IC device 100 including the test pads 102-1 and 102-2 and functional pads 120-4 through 120-8 in accordance with embodiments of the present disclosure. Test elements 110 are positioned between test pads 102-1 and 102-2 as not to occupy die space for functional elements 105. Test pad 102-1 also functions as one of a supply voltage pad or a ground pad for functional elements 105. In other embodiments (not shown in FIG. 4), the IC device 100 may be positioned in at least one of a dual in-line package (DIP), a gull wing surface mount package, a pin grid array (PGA) package, a leadless chip carrier (LCC) package which is also known as a quad flat no-leads (QFN) package, a ball grid array (BGA) package, or a multi-chip module (MCM) version of any aforementioned package, or may be directly bonded to a ceramic substrate or printed circuit board (PCB) or any suitable hybrid. In other embodiments, the parametric test system may measure the parametric value after the IC device 100 is packaged.

Figure 5:
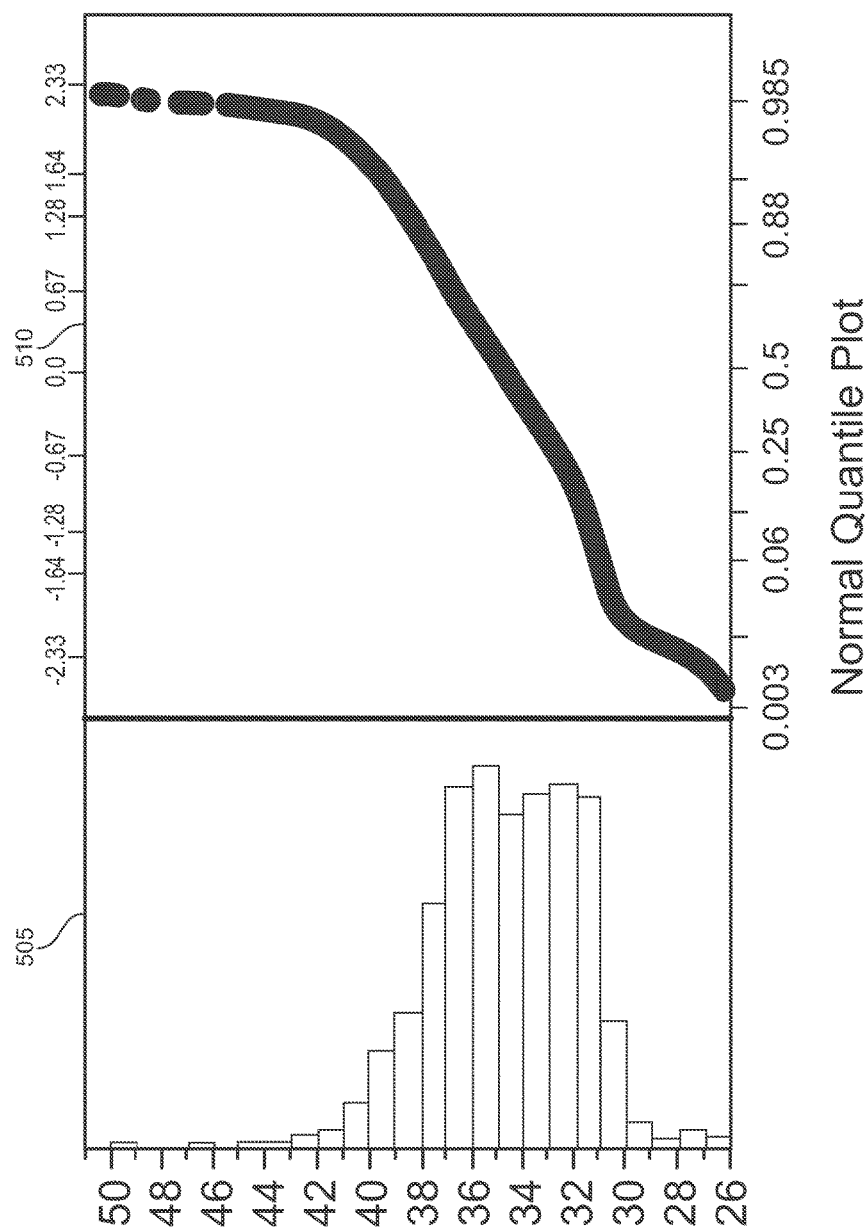
FIG. 5 is a histogram and a normal quantile plot of multiple IC devices versus resistance measurements of their respective test structures across multiple wafers in accordance with embodiments of the present disclosure.

FIG. 5 illustrates a histogram 505 and a normal quantile plot 510 of multiple IC devices 100 versus resistance measurements of their respective test structures across multiple wafers in accordance with embodiments of the present disclosure. Resistive values (i.e. parametric values) from test structures of approximately 5000 IC devices were used. The left axis is in ohms illustrating typical resistive values of 30 to 40 ohms.

Figure 6:
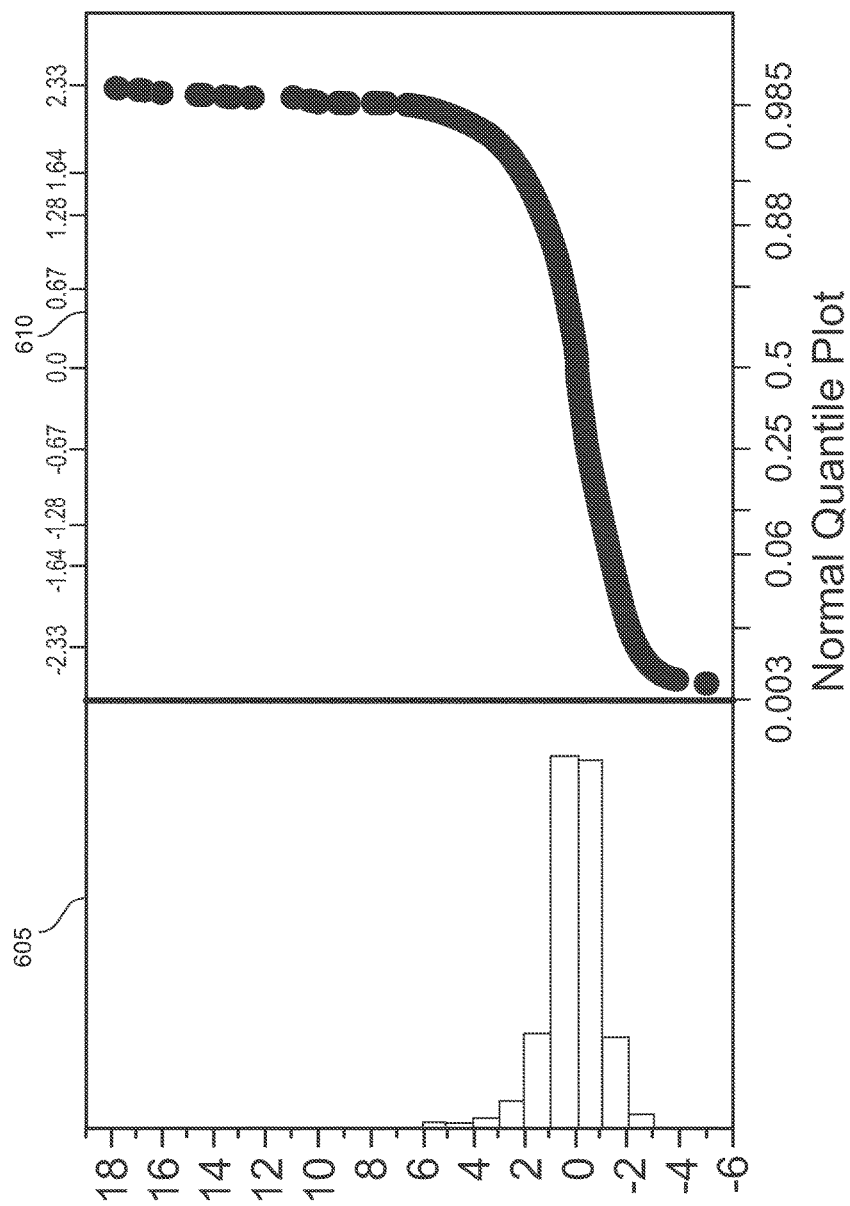
FIG. 6 is a histogram and a normal quantile plot of multiple IC devices versus resistance measurements of their respective test structures across a single wafer in accordance with embodiments of the present disclosure.

FIG. 6 illustrates a histogram 605 and a normal quantile plot 610 of multiple IC devices 100 versus resistance measurements of their respective test structures across the same population of wafers as in FIG. 5, in accordance with embodiments of the present disclosure. The left axis is a measured resistance of a given IC minus a median value of all the resistance measurements across the wafer that IC was taken from. The measurements that fall outside the normal distribution of resistance are much more clearly distinguished in FIG. 6 compared to FIG. 5. As such, IC devices 100 that are outliers may be identified with higher confidence on a given wafer.

FIG. 7 illustrates a schematic diagram of an IC device 700 that includes multiple functional elements 705 and multiple test elements 710 in accordance with embodiments of the present disclosure. Each test element 715 of test elements 710 is electrically coupled in parallel between a first test port 720-1 and a second test port 720-2, forming a test structure. Each test element 715 may be substantially similar to each functional element 725 of functional elements 705. For example, each test element 715 and each functional element 725 may be a basic transistor element associated with a manufacturing process of the IC device 700. The basic transistor element may be a BJT or a field-effect transistor (FET). In other embodiments each test element 715 and each functional element 725 may be a diode or a capacitor. In other embodiments, the IC device 700 may be a digital application specific integrated circuit (ASIC). In other embodiments, the IC device 700 may be an analog ASIC. In other embodiments, the IC device 700 may be a mixed-signal ASIC. In other embodiments, test elements 710 may number between 2 and 20. Test elements 715 and functional elements 705 may be at least 20 functional elements 725.

A method of testing the IC device 700 includes applying an electrical stimulus between the first and second test ports 720-1 and 720-2, and measuring a parametric value in response to the electrical stimulus. A predicted performance parameter of a first functional element 725 of functional elements 705 is determined based on the parametric value and an integer quantity of test elements 710. The predicted performance parameter may be determined at least in part by dividing the parametric value by the integer quantity. The parametric value may be a current value. The described method may allow a predicted performance parameter to be determined that is too minimal in value for known test instruments to measure directly.

In other embodiments, the electrical stimulus may be a voltage bias stimulus applied across the first and second test ports 720-1 and 720-2 by a parametric test system. The parametric value may be a total leakage current that is a sum of a leakage current of each test element 715. As such, an average leakage current may be calculated by dividing the parametric value by the integer quantity of test elements 710. The average leakage current may be representative of the predicted performance parameter.

In other embodiments, the predicted performance parameter may be one of a FET gate leakage current, a FET drain-source leakage current, a BJT emitter-collector leakage current, a diode reverse bias leakage current, or a capacitor leakage current. The initial values measured for such parameters may be correlated to the long-term stability (reliability) of the various IC elements, and therefore if the leakage is anomalously high on a test structure intended to measure such parameters, an IC can be screened for outliers.

In other embodiments, the first and second test ports 720-1 and 720-2 may be probing pads on an IC wafer, and the IC wafer may have multiple IC devices 700.

In other embodiments, the first and second test ports 720-1 and 720-2 may be bonding pads on the IC device 700. In other embodiments, the first and second test ports 720-1 and 720-2 may be isolated pads used primarily for manufacturing test without any electrical connection to functional elements 705. In other embodiments, the first test port 720-1 may be one of a supply voltage pad or a ground pad for functional elements 705.

In another embodiment, each test element 715 of FIG. 7 may include both a linear element and a non-linear element. The linear element may be a transistor coupled in series with a diode. A method of testing the IC device 700 includes applying first and second electrical stimuli between the first and second test ports 720-1 and 720-2, and measuring first and second parametric values in response to the electrical stimuli. A predicted performance parameter of a first functional element 725 of functional elements 705 may be determined based on the first and second parametric values and an integer quantity of test elements 710. The electrical stimuli may include first and second voltage biases. In other embodiments, the electrical stimuli may include first and second current biases.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Therefore, the embodiments disclosed should not be limited to any single embodiment, but rather should be construed in breadth and scope in accordance with the appended claims.

What is claimed is:

1. A method of testing an integrated circuit (IC) device, the IC device comprising a plurality of functional elements and a plurality of test elements, wherein the plurality of test elements are electrically coupled in series between a first test port and a second test port, the method comprising:
   applying an electrical stimulus between the first test port and the second test port;
   measuring a parametric value in response to the electrical stimulus;
   comparing the parametric value and a statistical value; and
   determining a pass or fail status of the IC device, wherein the statistical value is representative of a predicted reliability of the IC device, wherein: each of the functional elements are substantially similar to a first test element of the plurality of test elements, and each of the plurality of test elements are substantially similar; the first test element comprises a bipolar junction transistor (BJT) having a base metal structure and an emitter metal structure; and the plurality of test elements are coupled such that the parametric value is representative of at least one of a width of the base metal structure width, a width of the emitter metal structure, and an alignment of the emitter metal structure to the base metal structure.

2. The method of claim 1, wherein the plurality of test elements is between 2 and 20 test elements.

3. The method of claim 2, wherein the plurality of functional elements is at least 20 functional elements.

4. The method of claim 1, wherein the predicted reliability is a predicted electromigration reliability.

5. The method of claim 4, wherein the parametric value is a resistive value.

6. The method of claim 5, wherein the electrical stimulus is applied by a parametric test system, and the first and second test ports are probing pads.

7. The method of claim 6, wherein the first test port is one of a supply voltage pad and a ground pad.

* * * * *